United States Patent
Li et al.

(10) Patent No.: US 9,059,735 B2
(45) Date of Patent: Jun. 16, 2015

(54) DECODING METHOD AND DECODING DEVICE

(71) Applicant: HUAWEI TECHNOLOGIES CO., LTD., Shenzhen (CN)

(72) Inventors: Yang Li, Chengdu (CN); Lili Jin, Chengdu (CN); Yu Zhao, Munich (DE); Zhiyu Xiao, Chengdu (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 296 days.

(21) Appl. No.: 13/873,765

(22) Filed: Apr. 30, 2013

(65) Prior Publication Data

US 2013/0254603 A1 Sep. 26, 2013

Related U.S. Application Data

(63) Continuation of application No. PCT/CN2012/071099, filed on Feb. 14, 2012.

(51) Int. Cl.
*H03M 13/00* (2006.01)
*H03M 13/03* (2006.01)
*H03M 13/27* (2006.01)
*H03M 13/29* (2006.01)
*H03M 13/15* (2006.01)

(52) U.S. Cl.
CPC .......... *H03M 13/03* (2013.01); *H03M 13/1515* (2013.01); *H03M 13/152* (2013.01); *H03M 13/2732* (2013.01); *H03M 13/2918* (2013.01); *H03M 13/2927* (2013.01)

(58) Field of Classification Search
CPC ................ H03M 13/03; G06F 11/10
See application file for complete search history.

(56) References Cited

U.S. PATENT DOCUMENTS

| | | | |
|---|---|---|---|
| 5,714,952 A | 2/1998 | Wada | |
| 5,983,383 A * | 11/1999 | Wolf | .............................. 714/755 |

(Continued)

FOREIGN PATENT DOCUMENTS

| | | |
|---|---|---|
| CN | 1153440 | 7/1997 |
| CN | 1293835 | 5/2001 |
| CN | 1440034 | 9/2003 |

OTHER PUBLICATIONS

Extended European Search Report dated Mar. 2, 2015 in corresponding European Patent Application No. 12732365.7.

(Continued)

*Primary Examiner* — Esaw Abraham
(74) *Attorney, Agent, or Firm* — Staas & Halsey LLP

(57) ABSTRACT

Embodiments of the present invention provide a decoding method and a decoding device. The method includes: performing iterative decoding on a multidimensional code to obtain incorrigible code words; determining locations of error bits in the incorrigible code words that are obtained by performing the iterative decoding on the multidimensional code, where the locations of error bits in the incorrigible code words are multidimensional coordinate locations of the error bits in the multidimensional code; correcting error bits of a part of the incorrigible code words in the multidimensional code according to the determined locations of the error bits in the incorrigible code words; and after the error bits of a part of the incorrigible code words in the multidimensional code are corrected, performing iterative decoding on the multidimensional code The embodiments of the present invention are applicable to the field of decoding technologies.

8 Claims, 4 Drawing Sheets

(56) References Cited

U.S. PATENT DOCUMENTS

| | | | |
|---|---|---|---|
| 6,052,815 A * | 4/2000 | Zook | 714/758 |
| 6,272,659 B1 * | 8/2001 | Zook | 714/774 |
| 6,611,939 B1 | 8/2003 | Noguchi | |
| 7,146,553 B2 | 12/2006 | Jarchi et al. | |
| 7,296,212 B1 * | 11/2007 | Hammons, Jr. | 714/781 |
| 7,310,768 B2 | 12/2007 | Eidson et al. | |
| 7,516,389 B2 * | 4/2009 | Song | 714/755 |
| 8,341,502 B2 * | 12/2012 | Steiner et al. | 714/774 |
| 8,996,793 B1 * | 3/2015 | Steiner et al. | 711/103 |
| 2003/0145274 A1 | 7/2003 | Hwang et al. | |
| 2004/0194005 A1 | 9/2004 | Huggett | |
| 2005/0204254 A1 | 9/2005 | Cucchi et al. | |
| 2011/0214039 A1 * | 9/2011 | Steiner et al. | 714/797 |

OTHER PUBLICATIONS

Chang et al., "A Reed-Solomon Product-Code (RS-PC) Decoder Chip for DVD Applications", IEEE Journal of Solid-State Circuits, vol. 36, No. 2, Feb. 2001, pp. 229-238.

Chinese Office Action dated Sep. 4, 2013 in corresponding Chinese Patent Application No. 201280000205.9.

International Search Report mailed Nov. 29, 2012 corresponding to PCT/CN2012/071099.

\* cited by examiner

DECODING METHOD AND DECODING DEVICE

CROSS-REFERENCE TO RELATED APPLICATIONS

This application is a continuation of International Application No. PCT/CN2012/071099, filed on Feb. 14, 2012, which is hereby incorporated by reference in its entirety.

FIELD OF THE INVENTION

The present invention relates to the field of communications technologies, and in particular, to a decoding method and a decoding device.

BACKGROUND OF THE INVENTION

In a communication system, it is desired that a bit error rate can be reduced as much as possible in a data transmission process. For example, a forward error correction (Forward error Correction, referred to as FEC) algorithm is adopted. The FEC is a technology for transmitting redundancy and transmitted data together by using a preset algorithm. A receiving apparatus has a capability of detecting and correcting, according to the redundancy, a plurality of error bits that may occur during transmission. However, because some fixed error modes exist, when an input bit error rate of a system is reduced, an output bit error rate of the system still keeps unchanged. The case that the input bit error rate is reduced while the output bit error rate is almost unchanged is referred to as an error floor (error floor), which case the system cannot tolerate.

In order to resist the error floor, in the prior art, solutions such as extracting soft decoding information for reference for a next level, increasing error correction accuracy, increasing one-time decoding accuracy, or limiting capacity in a decoding preliminary phase to avoid error reproduction exist. However, on the whole, it is very difficult to reduce the error floor to a requirement of a system by using the foregoing solutions, and an error correction method during decoding is complicated.

SUMMARY OF THE INVENTION

Embodiments of the present invention provide a decoding method and a decoding device, so that an output bit error rate can be reduced and decoding is simple, thereby improving an anti-interference capability of a system.

In order to achieve the foregoing objective, the embodiments of the present invention adopt the following technical solutions.

A decoding method includes:

performing iterative decoding on a multidimensional code to obtain incorrigible code words, where the number of error bits of a code word in each dimension where error bits of the incorrigible code words are located is greater than the capacity of the multidimensional code;

determining locations of error bits in the incorrigible code words that are obtained by performing the iterative decoding on the multidimensional code, where the locations of the error bits in the incorrigible code words are multidimensional coordinate locations of the error bits in the multidimensional code;

correcting error bits of a part of the incorrigible code words in the multidimensional code according to the determined locations of the error bits in the incorrigible code words, so that the number of error bits of a code word in each dimension where the error bits of the incorrigible code words are located is less than the capacity of the multidimensional code; and after the error bits of a part of the incorrigible code words in the multidimensional code are corrected, performing iterative decoding on the multidimensional code in which the number of error bits of a code word in each dimension where the error bits of the incorrigible code words are located is less than the capacity of the multidimensional code.

A decoding device includes:

a first decoding unit, configured to perform iterative decoding on a multidimensional code to obtain incorrigible code words, where the number of error bits of a code word in each dimension where error bits of the incorrigible code words are located is greater than the capacity of the multidimensional code;

a location determining unit, configured to determine locations of error bits in the incorrigible code words that are obtained by the first decoding unit, where the locations of the error bits in the incorrigible code words are multidimensional coordinate locations of the error bits in the multidimensional code;

an error correcting unit, configured to correct error bits of a part of the incorrigible code words in the multidimensional code according to the locations of the error bits in the incorrigible code words, where the locations of the error bits in the incorrigible code words are determined by the location determining unit, so that the number of error bits of a code word in each dimension where the error bits of the incorrigible code words are located is less than the capacity of the multidimensional code; and a second decoding unit, configured to, after the error correcting unit corrects the error bits of a part of the incorrigible code words in the multidimensional code, perform iterative decoding on multidimensional code words, where the number of error bits of a code word in each dimension where the error bits of the incorrigible code words are located is less than the capacity of the multidimensional code.

The embodiments of the present invention provide a decoding method and a decoding device. First, incorrigible code words are obtained by performing iterative decoding on a code word; then locations of error bits of the obtained incorrigible code words are determined; and afterwards, error bits of a part of the determined incorrigible code words are corrected in real time, so that the output bit error rate can be reduced. Meanwhile, the decoding method is simple, thereby improving the anti-interference capability of the system.

BRIEF DESCRIPTION OF THE DRAWINGS

To illustrate the technical solutions in the embodiments of the present invention or in the prior art more clearly, the accompanying drawings required for describing the embodiments or the prior art are introduced briefly in the following. Apparently, the accompanying drawings in the following descriptions only show some of the embodiments of the present invention, and persons of ordinary skill in the art may still obtain other drawings according to these accompanying drawings without creative efforts.

FIG. 3($b$) is a schematic diagram of a fixed mode error of another code word;

DETAILED DESCRIPTION OF THE EMBODIMENTS

The technical solutions in the embodiments of the present invention are described clearly and completely in the following with reference to the accompanying drawings in the embodiments of the present invention. Apparently, the embodiments to be described are only a part rather than all of the embodiments of the present invention. Based on the embodiments of the present invention, all other embodiments obtained by persons of ordinary skill in the art without making creative efforts shall fall within the protection scope of the present invention.

Embodiment 1

Figure 1:
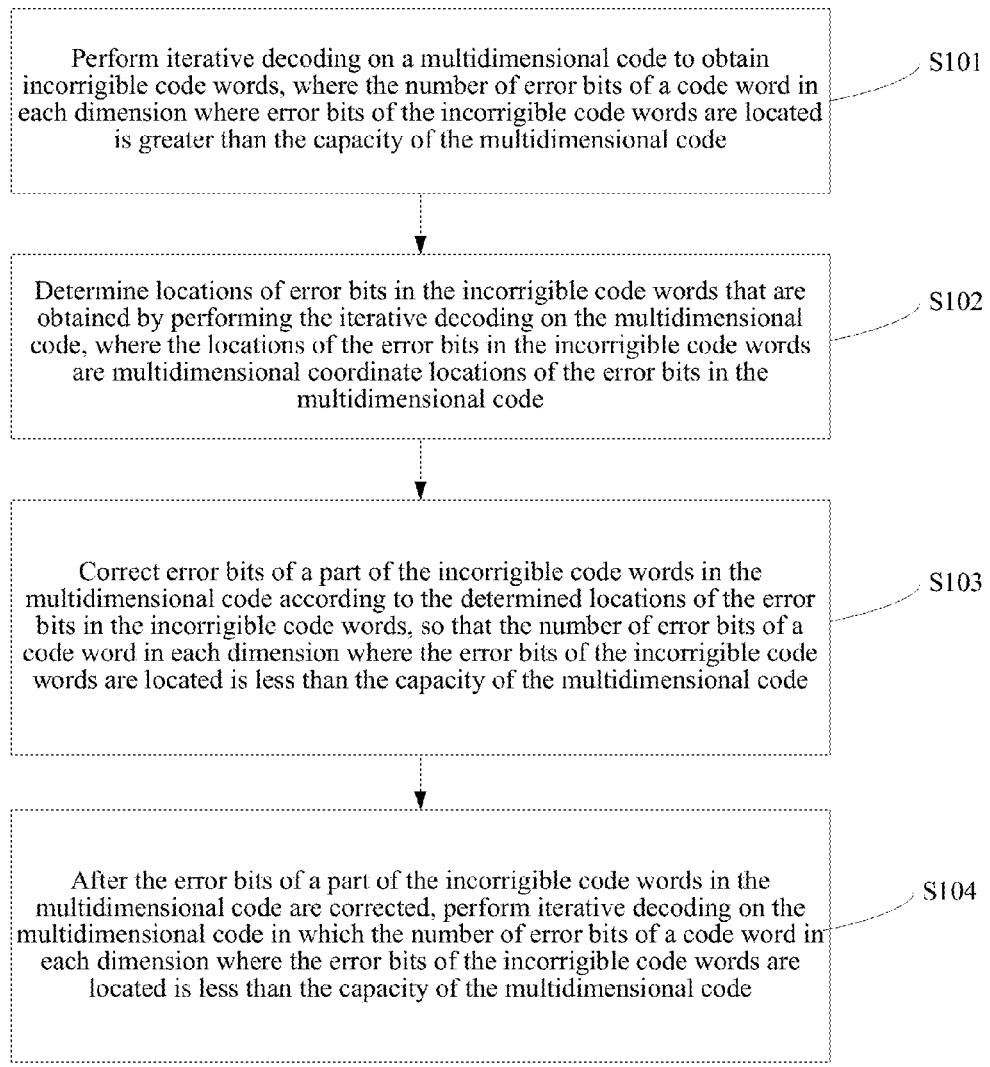
FIG. 1 is a flow chart of a decoding method according to an embodiment of the present invention.

Embodiment 1 of the present invention provides a decoding method. As shown in FIG. 1, the method includes:

S101: Perform iterative decoding on a multidimensional code to obtain incorrigible code words, where the number of error bits of a code word in each dimension where error bits of the incorrigible code words are located is greater than the capacity of the multidimensional code.

Figure 3A:
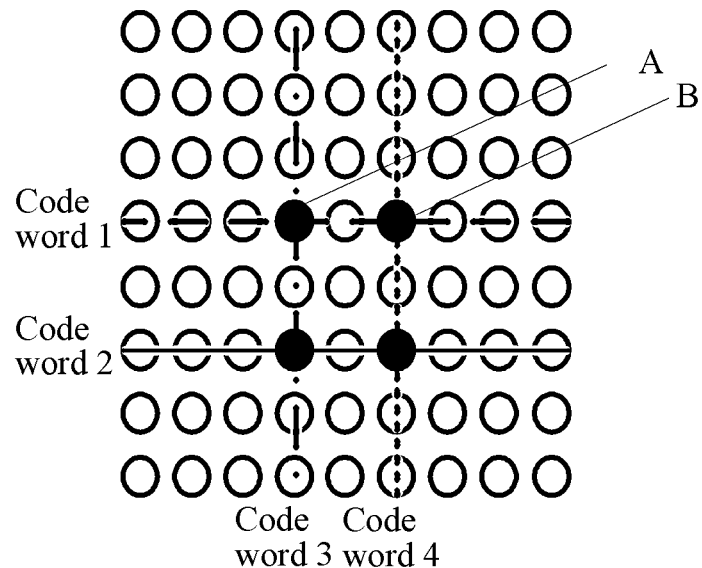
FIG. 3($a$) is a schematic diagram of a fixed mode error of a code word.
Figure 3B:
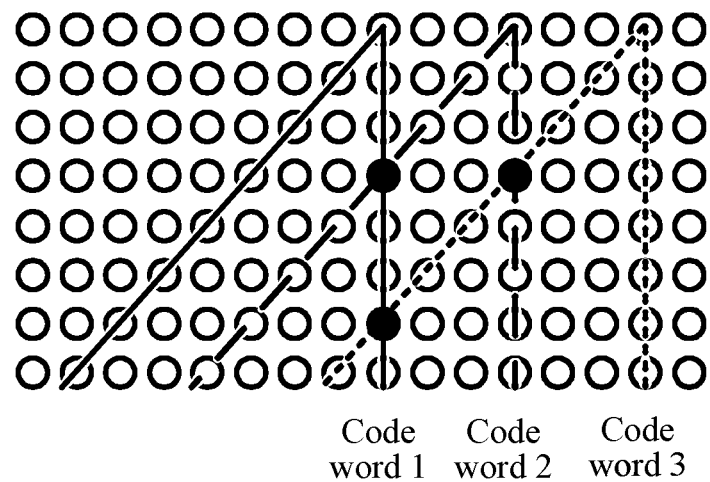

Specifically, the multidimensional code may be a convolutional interleaved code. The multidimensional code is a code of more than two dimensions, and includes a two-dimensional code. The incorrigible code words are specifically code words formed in some fixed error modes, for example, code words in a "#" shape. For example, as shown in FIG. 3(a) and FIG. 3(b), exemplarily, one circle represents 1 bit. In FIG. 3(a), capacity of the two-dimensional code is 1, the number of error bits of a code word 1 in a horizontal direction corresponding to error bits A and B in the multidimensional code is 2, and the number of error bits of each of a code word 3 and a code word 4 in a vertical direction corresponding to the error bits A and B is also 2. The numbers of error bits of the code word 1, a code word 2, the code word 3, and the code word 4 are all greater than the capacity of the two-dimensional code. Error bits of the multidimensional code cannot be corrected through iterative decoding by adopting a BCH (Bose, Ray-Chaudhuri, and Hocquenghem) or an RS (Reed-solomon codes, Reed-solomon codes) decoding method. In this case, a decoder considers that the code word 1, the code word 2, the code word 3, and the code word 4 in the two-dimensional code are incorrigible code words. In FIG. 3(b), the capacity of the multidimensional code is 1. In the figure, circles which are passed through by a full line form a code word 1, circles which are passed through by a dashed line form a code word 2, and circles which are passed through by a dotted line form a code word 3, where solid circles represent error bits. The number of error bits of a code word that is in each dimension and corresponds to the error bits of the multidimensional code is greater than 1, that is, the code words 1 to 3 are also incorrigible code words.

S102: Determine locations of error bits in the incorrigible code words are obtained by performing the iterative decoding on the multidimensional code, where the locations of the error bits in the incorrigible code words are multidimensional coordinate locations of the error bits in the multidimensional code.

After obtaining the incorrigible code words, a decoder may determine locations and values of the error bits by adopting a decoding method such as BCH or RS in the prior art, and may also calculate the locations and the values of the error bits by adopting a closed solution, which is not described herein again. Definitely, the locations of the error bits of the incorrigible code words are specifically multidimensional coordinate values of the error bits in the multidimensional code. As shown in FIG. 3(a), two-dimensional coordinate values of the error bits of the code word 1 are (4, 4) and (4, 6) respectively, two-dimensional coordinate values of the error bits of the code word 2 are (6, 4) and (6, 6) respectively, two-dimensional coordinate values of the error bits of the code word 3 are (4, 4) and (6, 4) respectively, and two-dimensional coordinate values of the error bits of the code word 4 are (4, 6) and (6, 6) respectively. As shown in FIG. 3(b), two-dimensional coordinate values of the error bits of the code word 1 are (9, 4) and (9, 7) respectively, two-dimensional coordinate values of the error bits of the code word 2 are (9, 4) and (12, 4) respectively, and two-dimensional coordinate values of the error bits of the code word 3 are (9, 7) and (12, 4) respectively.

S103: Correct error bits of a part of the incorrigible code words in the multidimensional code according to the determined locations of the error bits in the incorrigible code words, so that the number of error bits of a code word in each dimension where the error bits of the incorrigible code words are located is less than the capacity of the multidimensional code.

After determining the locations of the error bits in the incorrigible code words, the decoder may correct only the error bits of a part of the incorrigible code words in the multidimensional code. In the multidimensional code in FIG. 3(b), the decoder may correct only the error bits of the code word 1, or correct the error bits of the code word 2, or correct error bits of any combination of two code words or three code words of the code words 1, 2, and 3, so that the number of error bits of a code word in each dimension where the error bits of the incorrigible code words are located may be less than the capacity of the multidimensional code.

S104: After the error bits of a part of the incorrigible code words in the multidimensional code are corrected, perform iterative decoding on the multidimensional code in which the number of error bits of a code word in each dimension where the error bits of the incorrigible code words are located is less than the capacity of the multidimensional code.

Further, after the decoder performs error correction on a part of the incorrigible code words in the multidimensional code, for the other remaining error bits in the multidimensional code word, an existing decoder, such as a BCH decoder or an RS decoder may be adopted to perform iterative decoding on the multidimensional code, so as to complete the decoding.

The embodiments of the present invention provide a decoding method and a decoding device. First, incorrigible code words are obtained by performing iterative decoding on a code word; then locations of error bits of the obtained incorrigible code words are determined; and afterwards, error bits of a part of the determined incorrigible code words are corrected in real time, so that an output bit error rate can be reduced. Meanwhile, the decoding method is simple, thereby improving the anti-interference capability of a system.

Embodiment 2

Figure 2:
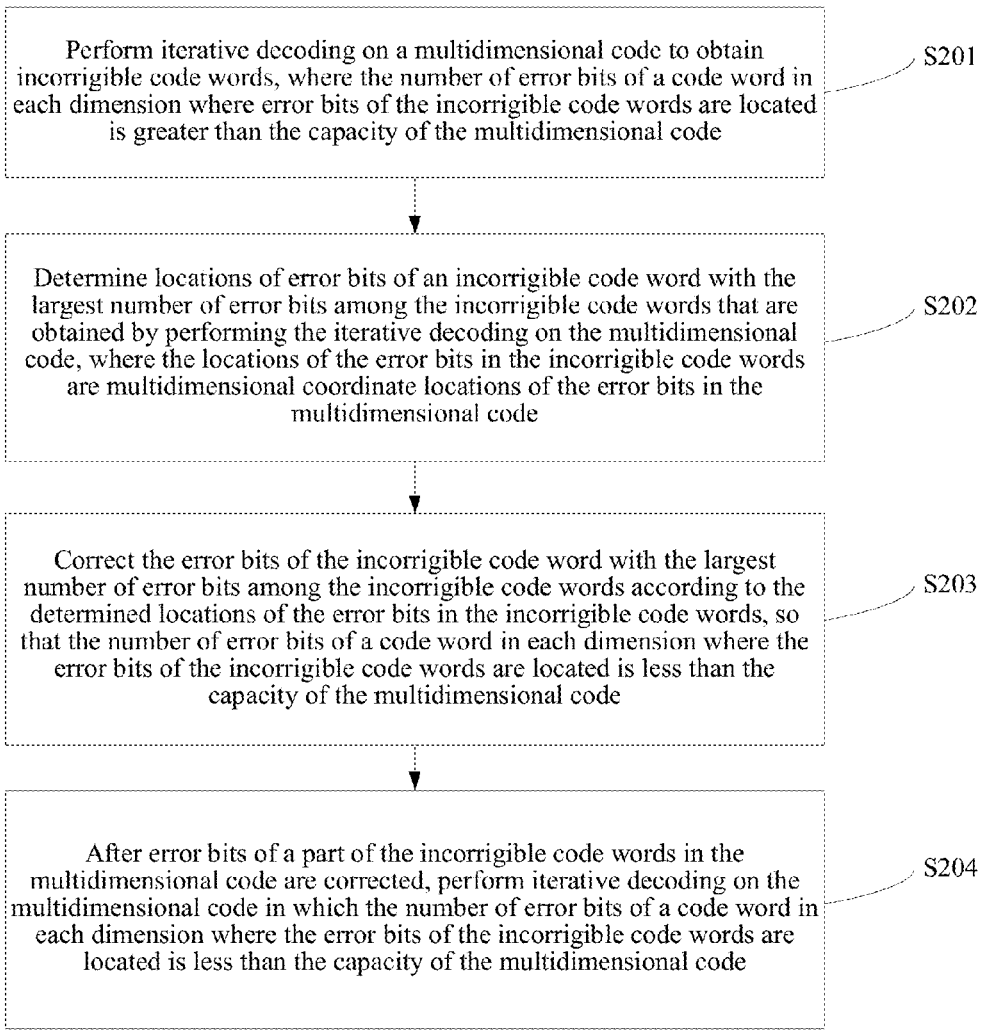
FIG. 2 is a flow chart of another decoding method according to an embodiment of the present invention.

An embodiment of the present invention provides a decoding method. As shown in FIG. 2, the method includes:

S201: Perform iterative decoding on a multidimensional code to obtain incorrigible code words, where the number of error bits of a code word in each dimension where error bits of the incorrigible code words are located is greater than the capacity of the multidimensional code.

Before data information is transmitted through a channel, to prevent the data information from losing or being interfered, the data information needs to be encoded. At a receiving end, a decoder performs error correction on channel n-dimensional encoded information and restores the encoded information to an original code word. This process is referred to as decoding, where n>=2. In the prior art, generally, the decoding is performed first along a first dimension of a code word, then along a second dimension, and then along a third dimension till along an $n^{th}$ dimension. Further, to improve an error correction capability, generally, iteration that is similar to the foregoing method (that is, decoding is performed in a first, a second, a third, . . . , and an $n^{th}$ dimensions) is performed multiple (m) times.

Specifically, at the receiving end, a decoding method may be a decoding method such as BCH or RS to perform iterative decoding on a code word m times. Different decoders have different code word capacity, that is, different decoders have different error correction capabilities. For example, code word capacity of a decoder is 3, that is, an error correction capability t of the decoder is equal to 3. In this case, after the decoder performs iterative decoding on a multidimensional code m times, if a plurality of error bits exists in all code words in a multidimensional direction where a certain error bit of the multidimensional code is located, and the number of error bits in each dimension where the certain error bit of the multidimensional code is located is greater than the capacity of the decoder, the decoder considers that a code word in each dimension where the error bit is located is an incorrigible code word. Specifically, as shown in FIG. 3(a) and FIG. 3(b), exemplarily, one circle represents 1 bit. In FIG. 3(a), capacity of a two-dimensional code is 1, the number of error bits of a code word 1 in a horizontal direction corresponding to error bits A and B in the multidimensional code is 2, and the number of error bits of a code word in a vertical direction corresponding to the error bits A and B is also 2. The numbers of error bits of the code word 1, a code word 2, a code word 3, and a code word 4 are all greater than the capacity of the two-dimensional code. Error bits of the multidimensional code cannot be corrected through iterative decoding by adopting a BCH decoder or an RS decoder. In this case, the decoder considers that the code word 1, the code word 2, the code word 3, and the code word 4 in the two-dimensional code are incorrigible code words. In FIG. 3(b), the capacity of the multidimensional code is 1. In the figure, circles which are passed through by a full line form a code word 1, circles which are passed through by a dashed line form a code word 2, and circles which are passed through by a dotted line form a code word 3, where solid circles represent error bits. The number of error bits of a code word that is in each dimension and corresponds to the error bits of the multidimensional code is greater than 1, that is, the code words 1 to 3 are also incorrigible code words.

S202: Determine locations of error bits of an incorrigible code word with the largest number of error bits among the incorrigible code words that are obtained by performing the iterative decoding on the multidimensional code, where the locations of the error bits in the incorrigible code words are multidimensional coordinate locations of the error bits in the multidimensional code.

After obtaining the incorrigible code words, the decoder determines locations of the error bits of the incorrigible code words. The decoder may determine the locations of the error bits in the incorrigible code words by adopting a decoding method such as BCH or RS in the prior art, and may also calculate the locations and values of the error bits by adopting a closed solution, which is not described herein again. Definitely, the locations of the error bits of the incorrigible code words are specifically multidimensional coordinate locations of the error bits in the incorrigible code words. As shown in FIG. 3(a), two-dimensional coordinate values of the error bits of the code word 1 are (4, 4) and (4, 6) respectively, two-dimensional coordinate values of the error bits of the code word 2 are (6, 4) and (6, 6) respectively, two-dimensional coordinate values of the error bits of the code word 3 are (4, 4) and (6, 4) respectively, and two-dimensional coordinate values of the error bits of the code word 4 are (4, 6) and (6, 6) respectively. As shown in FIG. 3(b), two-dimensional coordinate values of the error bits of the code word 1 are (9, 4) and (9, 7) respectively, two-dimensional coordinate values of the error bits of the code word 2 are (9, 4) and (12, 4) respectively, and two-dimensional coordinate values of the error bits of the code word 3 are (9, 7) and (12, 4) respectively.

Further, to increase a decoding rate, the decoder may determine only locations of error bits of an incorrigible code word with the largest number of error bits among the incorrigible code words, and correct the error bits of the incorrigible code word with the largest number of error bits in real time, so that the incorrigible code word does not need to be stored, thereby rapidly and effectively breaking an error floor mode.

For example, in a convolutional interleaved code, a code word with the relatively large number of error bits and with the relatively large number of error codes may be obtained through calculation according to probability statistics. Generally, in a convolutional interleaved code, a code word with the largest number of error bits is a first code word.

S203: Correct the error bits of the incorrigible code word with the largest number of error bits among the incorrigible code words according to the determined locations of the error bits in the incorrigible code words, so that the number of error bits of a code word in each dimension where the error bits of the incorrigible code words are located is less than the capacity of the multidimensional code.

Definitely, in order to reduce decoding complexity, after the locations of the error bits in the incorrigible code words are determined, only an incorrigible code word with the largest number of error bits may be corrected. If the number of error bits of a code word in each dimension is the same, locations of error bits of a code word in a certain dimension are determined randomly.

Figure 4:
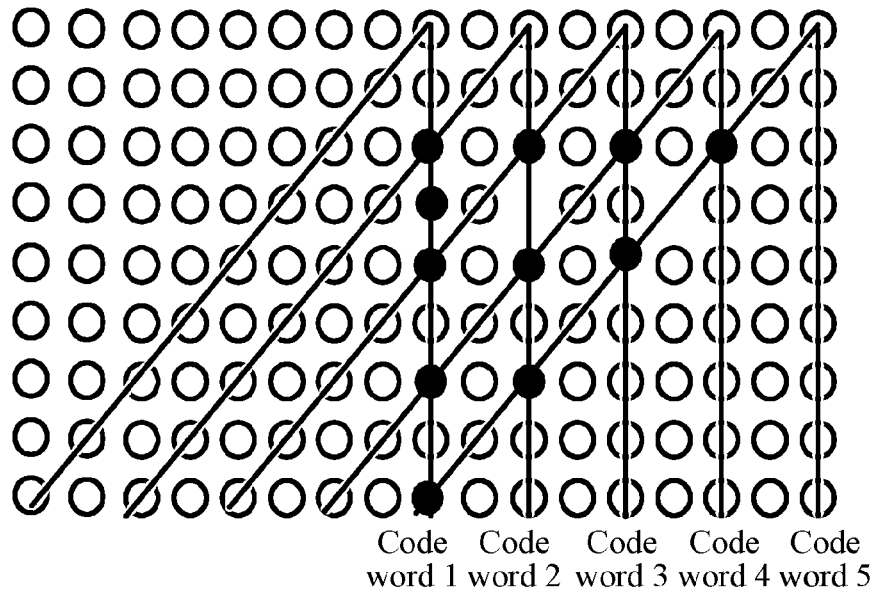
FIG. 4 is a schematic diagram of a fixed mode error of another code word.

As shown in FIG. 4, capacity of incorrigible code words of the convolutional interleaved code is 3. In FIG. 4, circles which are passed through by each continuous full line form a code word, such as code words 1 to 5 shown in FIG. 4. The number of error bits of the code word 1 is 5, and the numbers of error bits of the code words 2, 3, 4, and 5 are all 4. The number of error bits of the code word 1 is the largest. The decoder may directly perform correction on the code word 1. After the correction is performed on the code word 1, the numbers of error bits of the code words 2, 3, and 4 are changed to 3, the decoder may perform decoding on the code words by adopting an existing decoding method.

S204: After error bits of a part of the incorrigible code words in the multidimensional code are corrected, perform iterative decoding on the multidimensional code in which the number of error bits of a code word in each dimension where the error bits of the incorrigible code words are located is less than the capacity of the multidimensional code.

Further, after error correction is performed on the multidimensional code, iterative decoding may be performed on the incorrigible code words by adopting an existing decoding method, such as a BCH or an RS decoding method, so as to complete the decoding.

With the decoding method provided in this embodiment of the present invention, first, incorrigible code words are obtained by performing iterative decoding on a code word; then locations of error bits of an incorrigible code word with the largest number of error bits in the multidimensional code are determined; and afterwards, the incorrigible code word with the largest number of error bits is corrected in real time, so that an output bit error rate can be reduced. Meanwhile, the decoding method is simple, thereby improving an anti-interference capability of a system.

Embodiment 3

Figure 5:
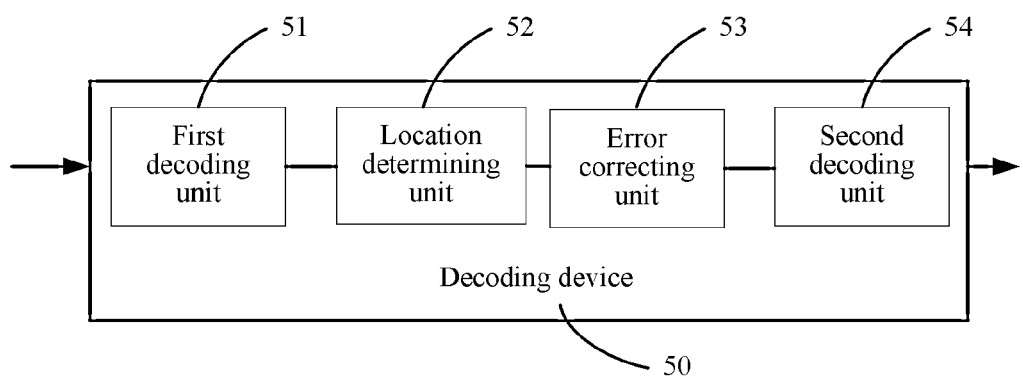
FIG. 5 is a structural block diagram of a decoding device according to an embodiment of the present invention.

An embodiment of the present invention provides a decoding device 50. As shown in FIG. 5, the device includes: a first decoding unit 51, a location determining unit 52, an error correcting unit 53, and a second decoding unit 54.

The first decoding unit 51 is configured to perform iterative decoding on a multidimensional code to obtain incorrigible code words, where the number of error bits of a code word in each dimension where error bits of the incorrigible code words are located is greater than the capacity of the multidimensional code.

Before data information is transmitted through a channel, to prevent the data information from losing or being interfered, the data information needs to be encoded. At a receiving end, the decoding device performs error correction on channel n-dimensional encoded information and restores the encoded information to an original code word. This process is referred to as decoding, where n>=2. In the prior art, generally, the decoding is performed first along a first dimension of a code word, then along a second dimension, and then along a third dimension till along an $n^{th}$ dimension. Further, to improve an error correction capability, generally, iteration that is similar to the foregoing method (that is, decoding is performed in a first, a second, a third, . . . , and an $n^{th}$ dimensions) is performed multiple (m) times.

Specifically, at the receiving end, the first decoding unit 51 may perform iterative decoding on a code word m times by adopting a decoding method such as BCH or RS. The first decoding unit 51 has certain code word capacity, that is, the first decoding unit 51 has a certain error correction capability. For example, the code word capacity of the first decoding unit 51 is 3, that is, an error correction capability t of the first decoding unit 51 is equal to 3. In this case, after the first decoding unit 51 performs iterative decoding on a multidimensional code m times, if a plurality of error bits exists in all code words in a multidimensional direction where a certain error bit of the multidimensional code is located, and the number of error bits in each dimension where the certain error bit of the multidimensional code is located is greater than the capacity 3 of the first decoding unit 51, in this way, the first decoding unit 51 considers that a code word in each dimension where the error bit is located is an incorrigible code word. Specifically, as shown in FIG. 3(a) and FIG. 3(b), exemplarily, one circle represents 1 bit. In FIG. 3(a), capacity of a two-dimensional code is 1, the number of error bits of a code word 1 in a horizontal direction corresponding to error bits A and B in the multidimensional code is 2, and the number of error bits of a code word in a vertical direction corresponding to the error bits A and B is also 2. The numbers of error bits of the code word 1, a code word 2, a code word 3, and a code word 4 are all greater than the capacity of the two-dimensional code. If the first decoding unit 51 performs iterative decoding by adopting the BCH or the RS decoding method, error bits of the multidimensional code cannot be corrected. In this case, the first decoding unit 51 considers that the code word 1, the code word 2, the code word 3, and the code word 4 in the two-dimensional code are incorrigible code words. In FIG. 3(b), the capacity of the multidimensional code is 1. In the figure, circles which are passed through by a full line form a code word 1, circles which are passed through by a dashed line form a code word 2, and circles which are passed through by a dotted line form a code word 3, where solid circles represent error bits. The number of error bits of a code word that is in each dimension and corresponds to the error bits of the multidimensional code is greater than 1, that is, the code words 1 to 3 are also incorrigible code words.

The location determining unit 52 is configured to determine locations of error bits in the incorrigible code words that are obtained by the first decoding unit 51, where the locations of the error bits in the incorrigible code words are multidimensional coordinate locations of the error bits in the multidimensional code.

After the incorrigible code words are obtained, the location determining unit 52 determines locations of the error bits of the incorrigible code words. The location determining unit 52 may determine the locations of the error bits in the incorrigible code words by adopting a decoding method such as BCH or RS in the prior art, and may also calculate the locations and values of the error bits by adopting a closed solution, which is not described herein again. Definitely, the locations of the error bits in the incorrigible code words are specifically multidimensional coordinate locations of the error bits in the incorrigible code words. As shown in FIG. 3(a), two-dimensional coordinate values of the error bits of the code word 1 are (4, 4) and (4, 6) respectively, two-dimensional coordinate values of the error bits of the code word 2 are (6, 4) and (6, 6) respectively, two-dimensional coordinate values of the error bits of the code word 3 are (4, 4) and (6, 4) respectively, and two-dimensional coordinate values of the error bits of the code word 4 are (4, 6) and (6, 6) respectively. As shown in FIG. 3(b), two-dimensional coordinate values of the error bits of the code word 1 are (9, 4) and (9, 7) respectively, two-dimensional coordinate values of the error bits of the code word 2 are (9, 4) and (12, 4) respectively, and two-dimensional coordinate values of the error bits of the code word 3 are (9, 7) and (12, 4) respectively.

Further, to increase a decoding rate, the location determining unit 52 may determine only locations of error bits of an incorrigible code word with the largest number of error bits among the incorrigible code words, and correct the error bits of the incorrigible code word with the largest number of error bits in real time, so that the incorrigible code word does not need to be stored, thereby rapidly and effectively breaking an error floor mode.

For example, for a convolutional interleaved code, the location determining unit 52 may obtain a code word with the relatively large number of error bits and with the relatively large number of error codes through calculation according to probability statistics. Generally, in a convolutional interleaved code, a code word with the largest number of error bits is a first code word.

The error correcting unit 53 is configured to correct error bits of a part of the incorrigible code words in the multidimensional code according to the locations of the error bits of the incorrigible code words, where the locations of the error bits in the incorrigible code words are determined by the location determining unit 52, so that the number of error bits of a code word in each dimension where the error bits of the incorrigible code words are located is less than the capacity of the multidimensional code.

After the determining unit 52 determines the locations of the error bits in the incorrigible code words, the error correcting unit 53 may correct only the error bits of a part of the incorrigible code words in the multidimensional code. In the multidimensional code in FIG. 3(b), the error correcting unit 53 may correct only the error bits of the code word 1, or correct the error bits of the code word 2, or correct error bits of any combination of two code words or three code words of the code words 1, 2, and 3, so that the number of error bits of a code word in each dimension where the error bits of the incorrigible code words are located may be less than the capacity of the multidimensional code.

Further, in order to reduce decoding complexity, after the locations of the error bits in the incorrigible code words are determined, the error correcting unit 53 may correct only an incorrigible code word with the largest number of error bits. If the number of error bits of a code word in each dimension is the same, locations of error bits in a certain dimension are determined randomly.

As shown in FIG. 4, capacity of incorrigible code words of the convolutional interleaved code is 3. In FIG. 4, circles which are passed through by each continuous full line form a code word, such as code words 1 to 5 shown in FIG. 4. The number of error bits of the code word 1 is 5, and the numbers of error bits of the code words 2, 3, 4, and 5 are all 4. The number of error bits of the code word 1 is the largest. The error correcting unit 53 may directly perform correction on the code word 1.

The second decoding unit 54 is configured to, after the error correcting unit corrects the error bits of a part of the incorrigible code words in the multidimensional code, perform iterative decoding on the multidimensional code, where the number of error bits of a code word in each dimension where the error bits are located is less than the capacity of the multidimensional code.

Further, after the error correction is performed on the multidimensional code, decoding may be performed by adopting an existing decoding method, for example, iterative decoding is performed on the incorrigible code words by adopting the BCH or the RS decoding method, so as to complete the decoding. For example, as shown in FIG. 4, after the correction is performed on the code word 1, the numbers of error bits of the code words 2, 3, and 4 are changed to 3, the decoding may be performed by adopting an existing decoding method.

With the decoding device provided in this embodiment of the present invention, first, a first decoding unit performs iterative decoding on a code word to obtain incorrigible code words; then a location determining unit determines locations of error bits of an incorrigible code word with the largest number of error bits; and afterwards, an error correcting unit performs, in real time, correction on the incorrigible code word with the largest number of error bits, so that an output bit error rate can be reduced. Meanwhile, the decoding method is simple, thereby improving an anti-interference capability of a system.

Persons of ordinary skill in the art may understand that all or part of the steps of the method embodiments may be implemented by a program instructing relevant hardware. The program may be stored in a computer readable storage medium. When the program runs, the steps of the method embodiments are performed. The storage medium may be any medium that is capable of storing program codes, such as a ROM, a RAM, a magnetic disk, or an optical disk.

The foregoing descriptions are only specific embodiments of the present invention, but are not intended to limit the protection scope of the present invention. Any variation or replacement that can be easily derived by those skilled in the art within the technical scope disclosed in the present invention shall all fall within the protection scope of the present invention. Therefore, the protection scope of the present invention shall be subject to the protection scope of the claims.

What is claimed is:

1. A decoding method, comprising:
    performing iterative decoding on a multidimensional code to obtain incorrigible code words, wherein the number of error bits of a code word in each dimension where error bits of the incorrigible code words are located is greater than the capacity of the multidimensional code;
    determining locations of error bits in the incorrigible code words that are obtained by performing the iterative decoding on the multidimensional code, wherein the locations of the error bits in the incorrigible code words are multidimensional coordinate locations of the error bits in the multidimensional code;
    correcting error bits of a part of the incorrigible code words in the multidimensional code according to the determined locations of the error bits in the incorrigible code words, so that the number of error bits of a code word in each dimension where the error bits of the incorrigible code words are located is less than the capacity of the multidimensional code; and
    after the error bits of a part of the incorrigible code words in the multidimensional code are corrected, performing iterative decoding on the multidimensional code.

2. The method according to claim 1, wherein the determining the locations of the error bits in the incorrigible code words that are obtained by performing the iterative decoding on the multidimensional code comprises: determining locations of error bits of an incorrigible code word with the largest number of error bits among the incorrigible code words; and
    the correcting the error bits of a part of the incorrigible code words in the multidimensional code according to the determined locations of the error bits in the incorrigible code words comprises: correcting the error bits of the incorrigible code word with the largest number of error bits among the incorrigible code words according to the determined locations of the error bits of the incorrigible code word with the largest number of error bits among the incorrigible code words.

3. The method according to claim 2, wherein, the iterative decoding is specifically performing decoding on the multidimensional code by adopting a BCH or an RS decoding method.

4. The method according to claim 2, wherein the multidimensional code is specifically a convolutional interleaved code.

5. A decoding device, comprising:
    a first decoding unit, configured to perform iterative decoding on a multidimensional code to obtain incorrigible code words, wherein the number of error bits of a code word in each dimension where error bits of the incorrigible code words are located is greater than the capacity of the multidimensional code;
    a location determining unit, configured to determine locations of error bits in the incorrigible code words that are obtained by the first decoding unit, wherein the locations of the error bits in the incorrigible code words are multidimensional coordinate locations of the error bits in the multidimensional code;

an error correcting unit, configured to correct error bits of a part of the incorrigible code words in the multidimensional code according to the locations of the error bits in the incorrigible code words, wherein the locations of the error bits in the incorrigible code words are determined by the location determining unit, so that the number of error bits of a code word in each dimension where the error bits of the incorrigible code words are located is less than the capacity of the multidimensional code; and a second decoding unit, configured to, after the error correcting unit corrects the error bits of a part of the incorrigible code words in the multidimensional code, perform iterative decoding on the multidimensional code.

6. The device according to claim 5, wherein the location determining unit is specifically configured to determine locations of error bits of an incorrigible code word with the largest number of error bits among the incorrigible code words; and the error correcting unit is specifically configured to correct the error bits of the incorrigible code word with the largest number of error bits among the incorrigible code words according to locations of error bits of a code word that is in a certain dimension and with the largest number of error bits, wherein the locations of the error bits of the code word are determined by the location determining unit.

7. The device according to claim 6, wherein the first decoding unit and the second decoding unit perform decoding on the multidimensional code by adopting a BCH or an RS decoding method.

8. The device according to claim 6, wherein the multidimensional code is specifically a convolutional interleaved code.

* * * * *